(12) United States Patent
Ishikawa et al.

(10) Patent No.: US 7,560,996 B2
(45) Date of Patent: Jul. 14, 2009

(54) FREQUENCY-MULTIPLIED CLOCK SIGNAL OUTPUT CIRCUIT

(75) Inventors: Yasuyuki Ishikawa, Kariya (JP); Yoshinori Teshima, Toyota (JP); Hideaki Ishihara, Okazaki (JP)

(73) Assignee: DENSO CORPORATION, Kariya (JP)

( * ) Notice: Subject to any disclaimer, the term of this patent is extended or adjusted under 35 U.S.C. 154(b) by 176 days.

(21) Appl. No.: 11/882,131

(22) Filed: Jul. 31, 2007

(65) Prior Publication Data

US 2008/0084250 A1 Apr. 10, 2008

(30) Foreign Application Priority Data

Oct. 6, 2006 (JP) ............................... 2006-275396
May 8, 2007 (JP) ............................... 2007-123404

(51) Int. Cl.
*H03L 7/181* (2006.01)

(52) U.S. Cl. ........................... 331/16; 331/1 A; 375/376

(58) Field of Classification Search ................. 331/1 A, 331/16; 375/376
See application file for complete search history.

(56) References Cited

U.S. PATENT DOCUMENTS

| 5,517,155 A | 5/1996 | Yamauchi et al. |
| 5,708,395 A | 1/1998 | Yamauchi et al. |
| 5,789,985 A | 8/1998 | Yamauchi et al. |

*Primary Examiner*—Robert Pascal
*Assistant Examiner*—James E Goodley
(74) *Attorney, Agent, or Firm*—Posz Law Group, PLC

(57) ABSTRACT

In a DPLL circuit, when the size of a data value which is output from a data latch circuit and should be naturally set in a 11-bit down-counter becomes equal to or more than 12 bits, an overflow preventing circuit substitutes the 11-bit data for the data value.

4 Claims, 5 Drawing Sheets

FREQUENCY-MULTIPLIED CLOCK SIGNAL OUTPUT CIRCUIT

CROSS REFERENCE TO RELATED APPLICATION

This application is based on and incorporates herein by reference Japanese Patent Applications No. 2006-275396 filed on Oct. 6, 2006 and No. 2007-123404 filed on May 8, 2007.

FIELD OF THE INVENTION

The present invention relates to a frequency-multiplied clock signal output circuit that counts a period of a reference clock signal by a clock signal having a short period which is output from a ring oscillator, and divides the counted reference period data according to a multiplication ratio to count down the data, to thereby generate a frequency-multiplied clock signal.

BACKGROUND OF THE INVENTION

A digital-controlled phase locked loop circuit (DPLL circuit) generates and outputs a clock signal POUT by multiplying the frequency of a reference clock signal PREF, for example, as disclosed in U.S. Pat. No. 5,517,155 (JP 7-283722A) and U.S. Pat. No. 5,708,395 (JP 8-265111A).

In U.S. Pat. No. 5,517,155, as shown in FIG. 6, a DPLL circuit 100 multiplies the frequency of a reference signal PREF that is input from an external circuit according to divisor data DV1 to DV10 of 10 bits representative of multiplication number to generate an output signal POUT The DPLL circuit starts outputting the output signal POUT upon receiving an operation start signal PSTB from the external circuit. Upon inputting a control signal PA of high level from the external circuit, a ring oscillator 42 outputs 16 multiphase clocks R1 to R16 having a given phase difference Tg. A pulse phase difference encoder circuit 44 encodes a period of an internal clock PB that is an ORed signal of a frequency-divided signal BOW produced by dividing the frequency of the output signal POUT by the multiplication number and the reference signal PREF by the multiphase clocks R1 to R16, which are output from the ring oscillator 42. The pulse phase difference encoder circuit 44 generates binary digital data DD1 to DD18 and DE1 to DE18 of 16 bits corresponding to the period of the reference signal PREF and a phase difference between the reference signal PREF and the frequency-divided signal BOW.

Also, a data control circuit 46 generates control data DM1 to DM19 of 19 bits for controlling the phase difference between the reference signal PREF and the output signal POUT to ½ of the period of the reference signal PREF on the basis of the data DD and DE. A divider 48 divides the control data DM by the divisor data DV1 to DV10 that is input from the external circuit. The divider 48 outputs the higher significant bit data DQ1 to DQ18 of 18 bits which are representative of divided values larger than 0 (decimal point) and the lower significant bit data DP1 to DP10 of 10 bits which are representative of divided values smaller than 0 (decimal point) as the division results, separately.

A data distributor circuit 50 outputs a select signal CDS that changes in the level at frequencies corresponding to the data DP, and outputs the frequency-divided signal BOW at a timing at which the output signal POUT is divided in the frequency by the divisor data DV. The data distributor circuit 50 further outputs a timing signal DLS representative of the latch timing of the data to a data latch circuit 52 at a subsequent stage. The data latch circuit 52 receives the select signal CDS and the timing signal DLS, and latches the higher significant bit data DQ that is output from the divider 48 when the timing signal DLS becomes high. Also, the data latch circuit 52 outputs the latch data DQ or data DQ+1 produced by adding "1" to the latch data DQ according to the select signal CDS, as the frequency control data CD1 to CD18 of 18 bits which is representative of the period of the output signal POUT A digital control oscillator circuit (DCO) 54 generates the output signal POUT of a period corresponding to the frequency control data CD from the data latch circuit 52 by using the multiphase clocks R1 to R16 that are output from the ring oscillator 42. A PLL operation control circuit 56 controls the operation timing of the respective circuits.

Specifically, the digital control oscillator circuit 54 sets the higher significant side data of the frequency control data CD in an internal down-counter, and counts down the data on the basis of a high-speed clock signal of the ring oscillator 42, to thereby produce the period of the frequency-multiplied clock signal POUT The frequency-multiplied clock signal POUT of the DPLL circuit 100 is supplied to a digital circuit such as a microcomputer as an operation clock signal.

In the above system, when the processing speed of the digital circuit is increased, the clock frequency of the ring oscillator 42 that is incorporated into the DPLL circuit 100 is made higher. The frequency has been about 100 MHz up to now, but reaches the GHz order in recent years. As a result, the down-counter within the digital control oscillator circuit 54 is required to conduct the count-down operation according to a higher-speed clock signal.

However, in general, the counter needs to more increase the margin of a time (operation margin) required for digit-up or digit-down as the number of digits is more increased. Accordingly, when only the ring oscillator 42 portion of the digital control oscillator circuit 54 is improved, and the down-counter portion is maintained as it is, the operation margin of the counter is reduced as much as the frequency of the count clock signal is increased.

In addition, taking a process variation in a semiconductor device, a variation in a supply voltage or a temperature, or a frequency variation in the reference clock signal PREF into consideration, the operation margin of the counter is further decreased. Thus, when data large in the number of digits is set, the count operation of the down-counter is not ensured. As a result, what value the frequency of the frequency-multiplied clock signal POUT becomes is unclear, and the operation of the digital circuit to which the clock signal is supplied is not also ensured.

SUMMARY OF THE INVENTION

The present invention has an object to provide a frequency-multiplied clock signal output circuit, which is capable of outputting the frequency of a frequency-multiplied clock signal in a stable state even when the frequency of the clock signal of a ring oscillator becomes higher.

According to one aspect of the present invention, when it is determined that a value of data to be set in a counter has a given number of digits or more, a fixed value is substituted for processing data so that the data value is made smaller than a value expressed by a given number of digits. Then, a counter counts data determined on the basis of the fixed value to generate a frequency-multiplied clock signal.

That is, in the case where only the number of digits of the counter is limited to ensure the operation margin according to a fact that the frequency of the clock signal that is generated and output from the ring oscillator becomes higher, when the data to be set exceeds the above number of digits, the subsequent processing data becomes a value largely departing from the reference period data that has been counted actually. Under the circumstances, the fixed value is substituted for the processing data, thereby making it possible to prevent the occurrence of the above trouble in advance, and to surely determine the period of the frequency-multiplied clock signal on the basis of the fixed value of the smaller value.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
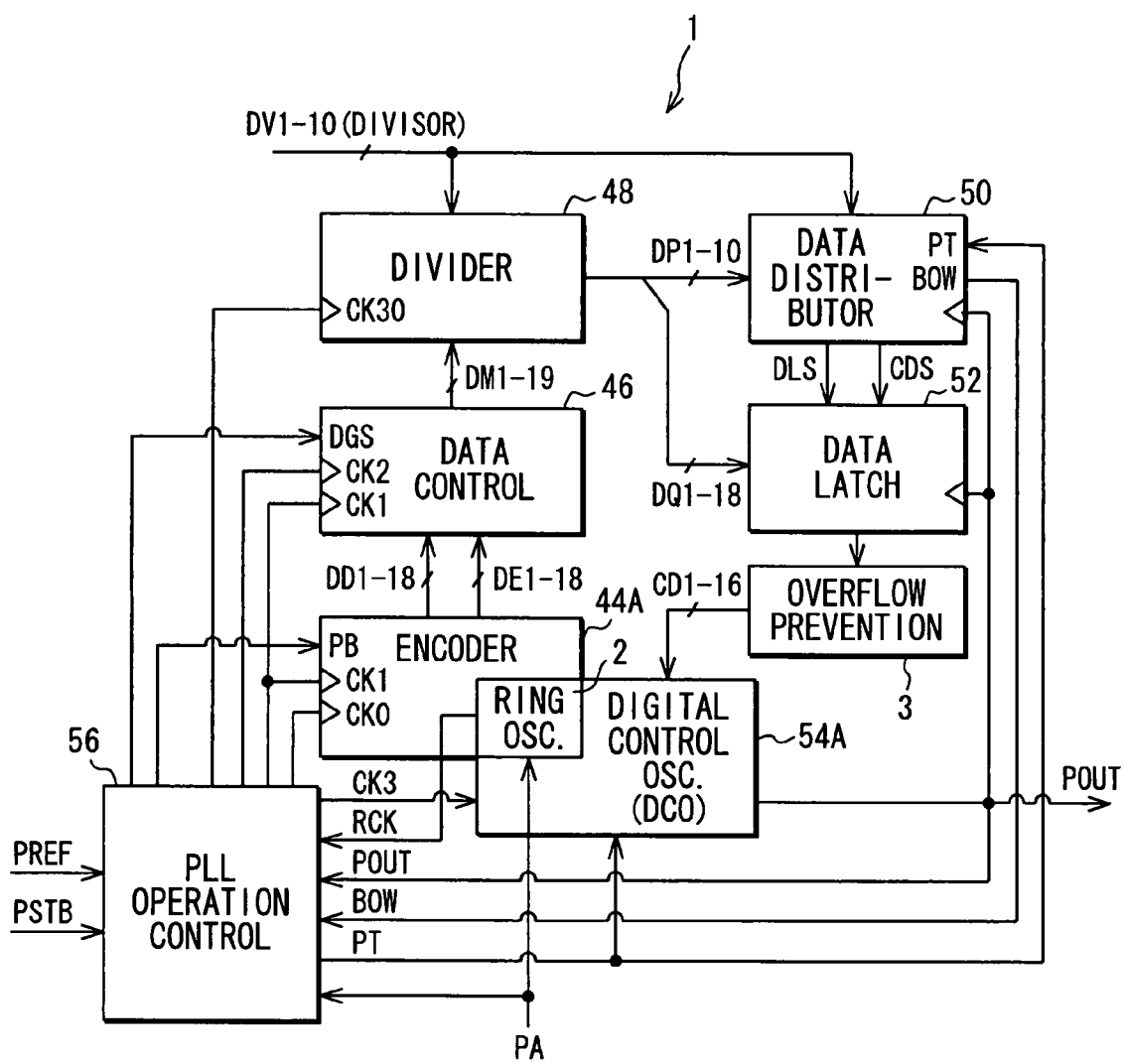
FIG. 1 is a circuit diagram showing a DPLL circuit according to a first embodiment of the present invention.

Referring first to FIG. 1, a first embodiment will be described in respect of difference from the circuit configuration shown in FIG. 6.

Figure 6:
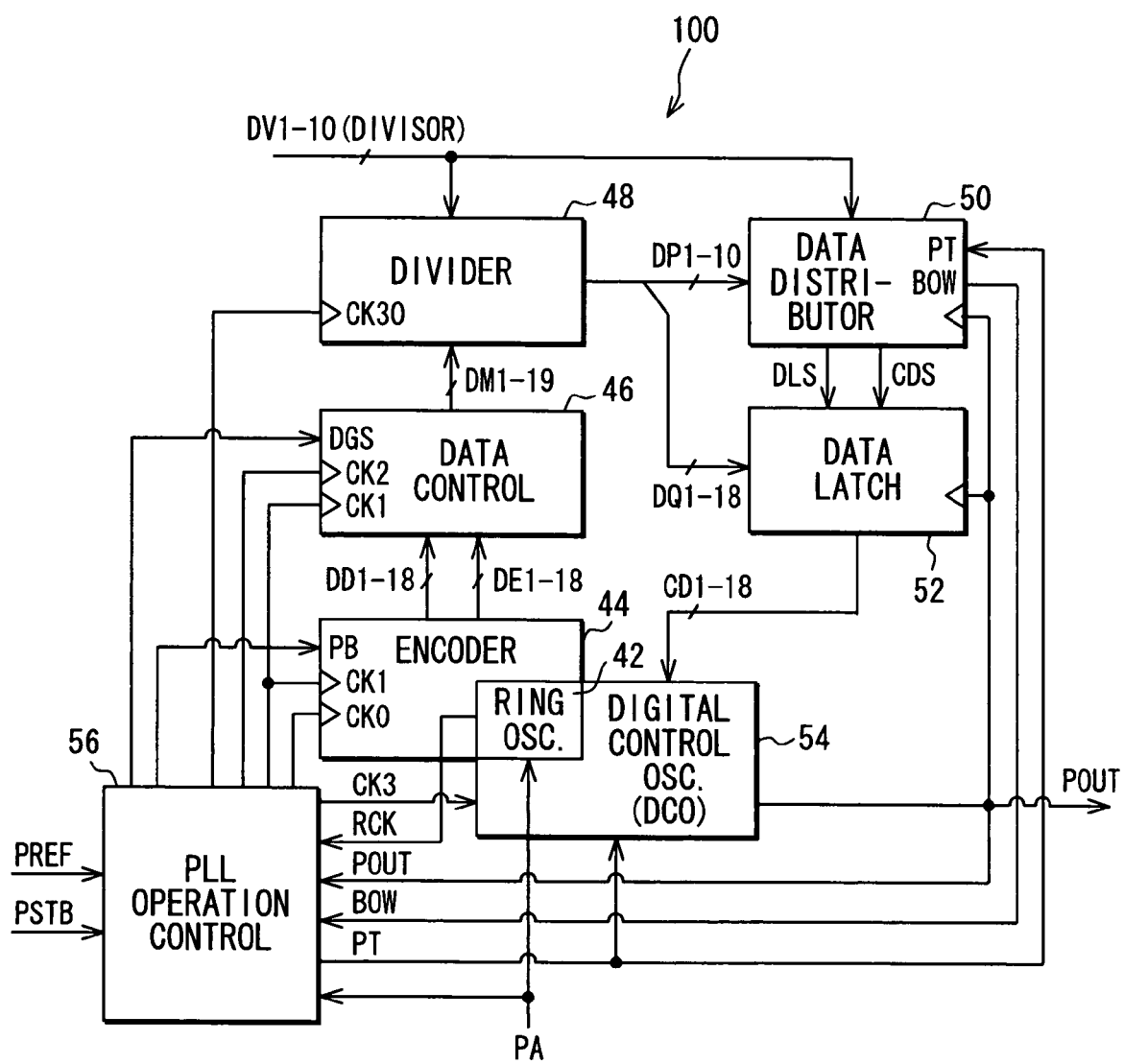
FIG. 6 is a circuit diagram showing a conventional DPLL circuit.

In a DPLL circuit (frequency-multiplied clock signal output circuit) 1, a ring oscillator 2 that forms a pulse phase difference encoder circuit 44A and a part of a digital control oscillator circuit 54A outputs a higher-speed clock signal higher than that of the ring oscillator 42 used in the conventional DPLL circuit 100 (FIG. 6). For example, the clock signal frequency that is generated by the ring oscillator 42 is about several hundreds MHz, whereas the clock signal frequency of the ring oscillator 2 is 1 GHz to several GHz.

Figure 3:
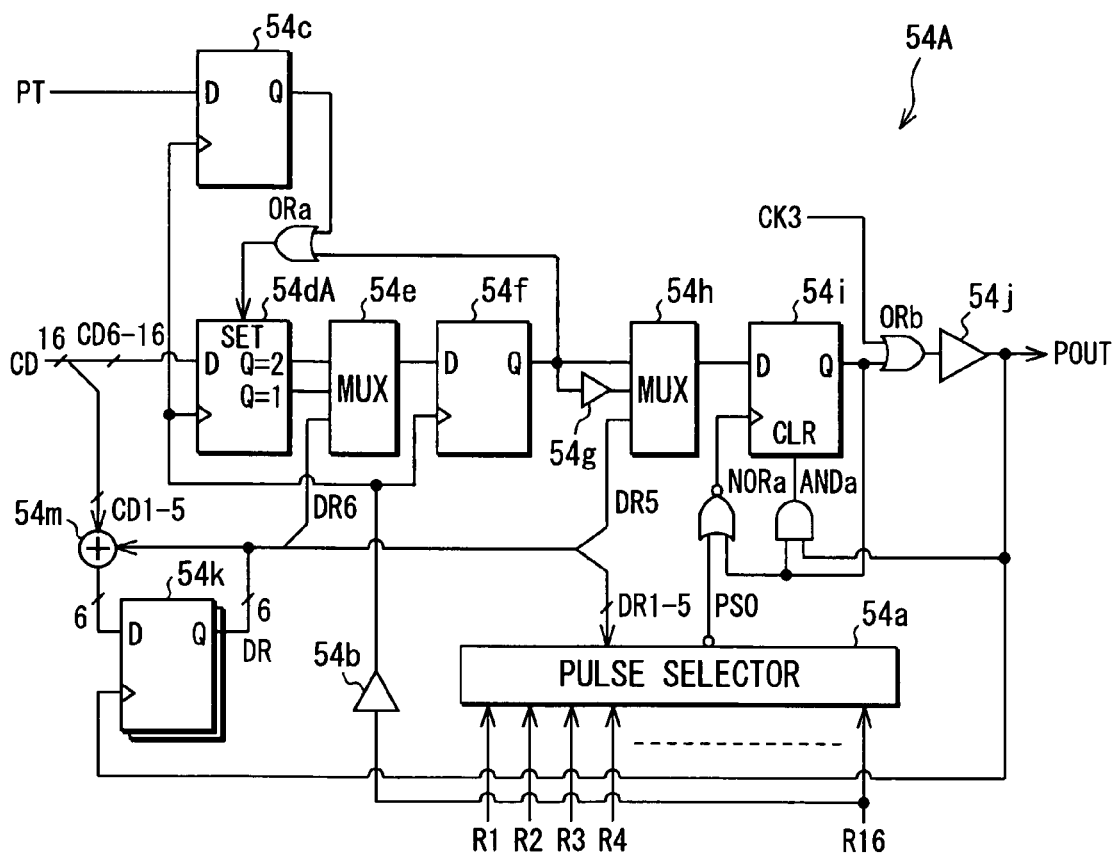
FIG. 3 is a circuit diagram showing a digital control oscillator circuit in the first embodiment.

The digital control oscillator circuit 54A may be configured as shown in FIG. 3. A down-counter 54dA reduces the number of digits by 2 bits as compared with the conventional down-counter 54d (U.S. Pat. No. 5,517,155) in order to ensure the operation margin according to the increased speed of the ring oscillator 2. Accordingly, the down-counter 54dA is given the higher significant data CD6 to CD16 of CD1 to CD16. The down-counter 54dA counts down the 11 bit data according to R16 that is one of the multiphase clock signals which are generated by the ring oscillator 2. That is, the number of bits of the data that is input to the digital control oscillator circuit 54A is reduced by 2 bits.

An overflow preventing circuit (data substituting means) 3 is provided between the data latch circuit 52 and the digital control oscillator circuit 54A. The overflow preventing circuit 3 conducts the substituting process of the input data CD6 to CD18 so as to prevent the count data given to the down-counter 54A from substantially overflowing.

In this example, the number of bits is limited to 11 bits so as to sufficiently ensure the operation margin of the down-counter 54dA with an increase in the speed of the clock signal R16 of the ring oscillator 2 as described above. Accordingly, a case where the values of the data CD6 to CD18 are equal to or more than 12 bits is defined as a "substantial overflow" state, because the count operation of the down-counter 54dA is not ensured.

Figure 2:
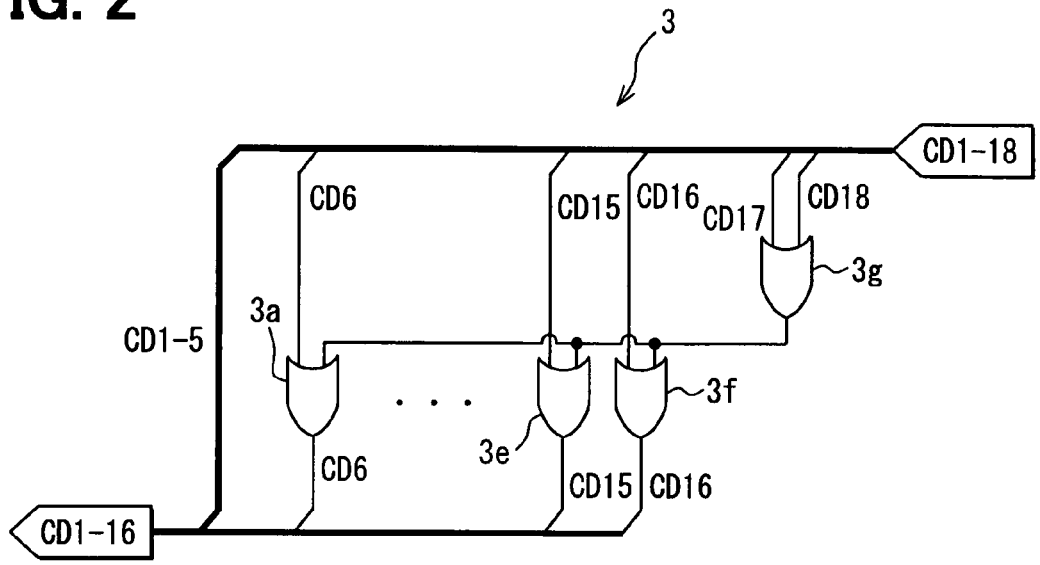
FIG. 2 is a circuit diagram showing an overflow preventing circuit in the first embodiment.

The overflow preventing circuit 3 may be configured as shown in FIG. 2. Specifically, the overflow preventing circuit 3 includes seven OR gates 3a to 3g, although only OR gates 3a, 3e, 3f, 3g are shown. The data CD1 to CD18 are supplied to the overflow preventing circuit 3 from the data latch circuit 52. The lower significant data CD1 to CD5 are output to the digital control oscillator circuit 54A as they are. On the other hand, the higher significant data CD6 to CD16 are output to the digital control oscillator circuit 54A through the OR gates 3a to 3f.

Also, the higher significant data CD17 and CD18 are given to an input terminal of the OR gate 3g, and an output terminal of the OR gate 3g is commonly connected to other input terminals of the OR gates 3a to 3f.

According to the first embodiment, when all of the input data CD17 and CD18 are "0", the output data CD6 to CD16 that are given to the down-counter 54dA of the digital control oscillator circuit 54A are output to the down-counter 54aA through the OR gates 3a to 3f.

Also, when any one of the input data CD17 and CD18 that are given from the data latch circuit 52 is "1", a fixed value of "1" is substituted for the data CD6 to CD16 that are given to the down-counter 54dA through the OR gate 3g and the OR gates 3a to 3f. Accordingly, the down-counter 54dA always counts down the data value of 11 bits, and the margin of the count operation is ensured. Then, the digital control oscillator circuit 54A generates the period of the frequency-multiplied clock signal POUT on the basis of the count operation of the down-counter 54dA.

That is, similarly, when at least any one of the data CD17 and CD18 is "1" the overflow is prevented because the data value of 11 bits are always given to the down-counter 54dA. Also, as an example of the "substantial overflow", when the values of the data CD6 to CD18 which are given from the data latch circuit 52 slightly overflow with respect to "11 bits" to indicate the following value.

"0100000000011" (left side is MSB)

When only the most significant two bits (that is, 0 and 1) are deleted, the following value is produced.

"XX00000000011"

In this case, the following processing data greatly departs from the period data of the reference clock signal that has been counted actually. On the contrary, when all of the lower significant data CD6 to CD16 are "1", the following value close to the actual data value is substituted for the processing data.

"xx11111111111"

Other circuit operation is perfectly identical with that of the contents disclosed in U.S. Pat. No. 5,517,155, which is therefore incorporated herein by reference.

Also, when the down-counter 54dA is designed as a 11-bit counter, it is assumed that the reference period data per se that counts the period of the reference clock signal PREF is limited according to the number of bits from the beginning to then design the entire down-counter. However, in this case, because setting the frequency of the frequency-multiplied clock signal POUT to be lower is limited, this embodiment is applied with a configuration in which the number of data bits is deleted during the calculation process.

As described above, when the size of the data value that is output from the data latch circuit 52 and should be naturally set in the down-counter 54dA of 11 bits becomes equal to or more than 12 bits, the overflow preventing circuit 3 substitutes 11-bit data for the data value.

Accordingly, even when the number of digits of the clock signal R16 is limited so that the down-counter 54dA surely operates according to the increased speed of the clock signal R16 that is generated from the ring oscillator 2, the data that is set in the down-counter 54dA is prevented from becoming a value greatly departing from the period data of the reference clock signal PREF which has been actually counted in advance. As a result, it is possible to surely determine the period of the frequency-multiplied clock signal POUT on the basis of the fixed value of the smaller value.

The overflow preventing circuit 3 sets all data of "1" in the down-counter 54dA as the substitution data. As a result, when the size of the data value becomes equal to or more than 12 bits, the overflow preventing circuit 3 supplies the maximum value represented by 11 bits to the down-counter 54dA, and determines the frequency of the frequency-multiplied clock signal POUT to a value closer to the actual data value. As a result, it is possible to stabilize the operation of the digital circuit to which the frequency-multiplied clock signal POUT is supplied.

Second Embodiment

Figure 4:
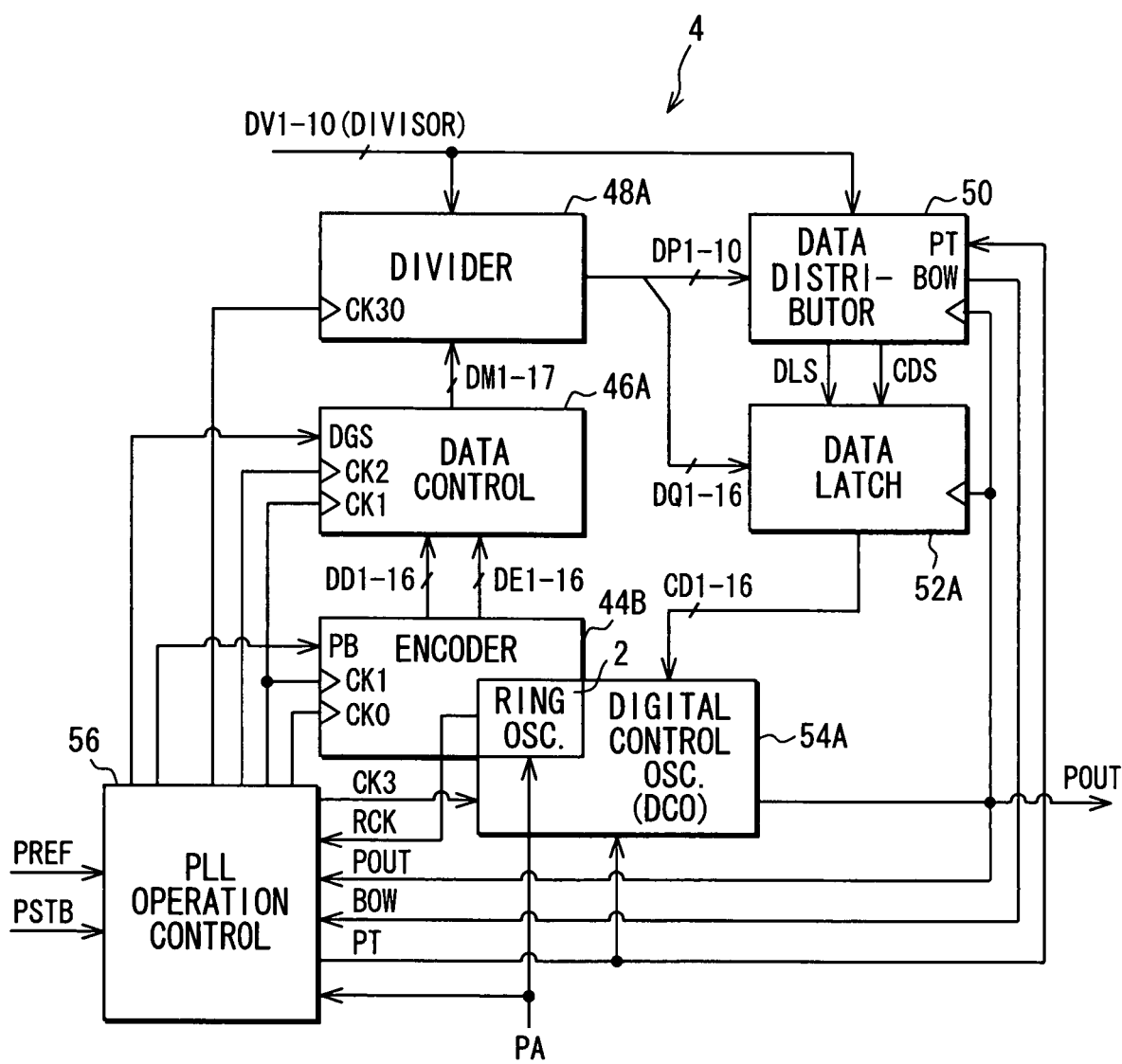
FIG. 4 is a circuit diagram showing a DPLL circuit according to a second embodiment of the present invention.
Figure 5:
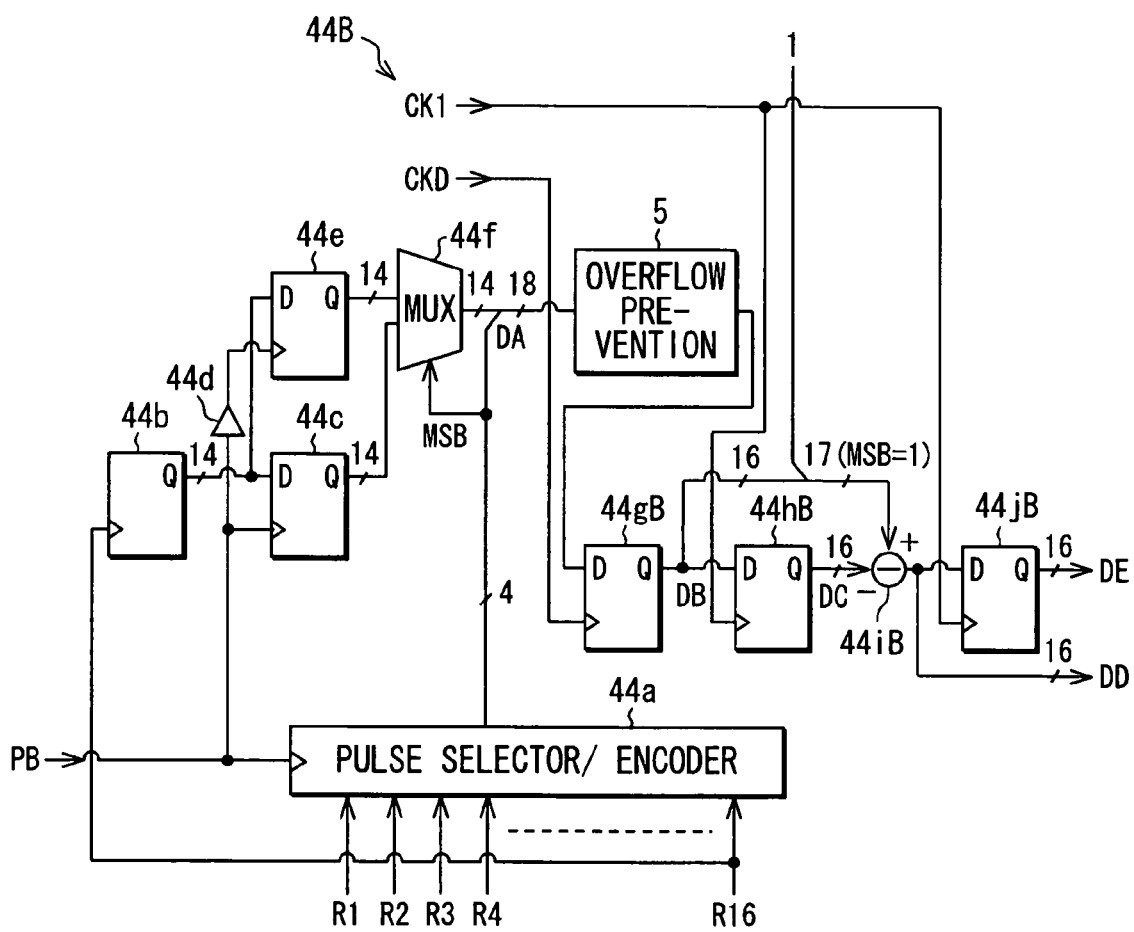
FIG. 5 is a circuit diagram showing a pulse phase difference encoder circuit in the second embodiment.

In the second embodiment shown in FIGS. 4 and 5, a DPLL circuit 4 does not include the overflow presenting circuit 3 of the first embodiment. Instead, the bit width of the data DD and DE which are output by a pulse phase difference encoder circuit 44B is limited to 16 bits. A data control circuit 46A, a divider 48A, and a data latch circuit 52A which receive the limited data deal with data whose most significant 2 bits are deleted such as data DQ1 to DQ16 or data CD1 to CD16.

The pulse phase difference encoder circuit 44B is shown in detail in FIG. 5. An overflow preventing circuit 5 is provided in the inside of the pulse phase difference encoder circuit 44B. In the pulse phase difference encoder circuit 44B, the 14 bit counter (reference period counter) 44b conducts the up-count operation on the basis of the clock signal R16 that is generated by the ring oscillator 2. The count data is latched by latch circuits 44c and 44e (reference period counters) on the basis of a leading edge timing of the internal clock RB. The internal clock RB is a logical addition signal of a signal BOW produced by dividing the frequency of the frequency-multiplied clock signal POUT by the multiplication number, and the reference signal PREF.

Any one of data that have been latched by the latch circuits 44c and 44e is selected by a multiplexer 44f according to the MSB of 4 bit data which is encoded by a pulse selector/encoder circuit 44a. The above 4 bit data is added to the data that has been selected by the multiplexer 44f, and the period data DA of 18 bits is output to a subsequent-stage latch circuit 44gA. That is, the period data DA is data that is measured according to the period of the reference signal PREF.

When the data value of the period data DA exceeds a given bit size, the overflow preventing circuit 5 outputs data in which "1" is substituted for all of the lower significant data as in the overflow preventing circuit 3 of the first embodiment. In the second embodiment, for example, when the data value of the period data DA becomes equal to or more than 17 bits, it is assumed that the down-counter 54dA of the subsequent stage "substantially overflows." Accordingly, in this situation, the overflow preventing circuit 5 outputs the data of all "1" of 16 bits.

Whether the down-counter 54dA becomes actually in the "overflow" state or not depends on a value of the multiplier data DV. Accordingly, the number of bits that determines "overflow" can be determined to an appropriate value according to an assumed range of the multiplier data DV.

That is, the data that is output to the downstream latch circuit 44gA by the overflow preventing circuit 5 is 16 bits. All of the data DB, DC, DD and DE that are output from the latch circuit 44gB and pass through the latch circuit 44hB, the subtractor 44iB, and the latch circuit 44jB are 16 bits. As a result, as described above, the most significant 2 bits are deleted from the respective data DM, DQ, and CD that are subsequently dealt with as compared with the first embodiment. Accordingly, the data size that is set in the down-counter 54dA of the digital control oscillator circuit 54A is 11 bits of the CD6 to CD16.

As described above, according to the second embodiment, the overflow preventing circuit 5 substitutes all 16 bits of "1" for the data value of the reference period data DA when the reference period data DA that has been counted by the counter 44b and latched by the latch circuit 44e or 44c becomes equal to or higher than 17 bits. As a result, the data that is dealt with by other circuits that are arranged at the subsequent stage is limited to the data size of the fixed value, thereby enabling the redundant configuration to be removed as much as possible.

The above embodiments may be modified in many ways.

For instance, the fixed data that is substituted can be appropriately selected to proper values other than "1."

Also, the position at which the data substituting means is arranged may be arranged at any positions when the data sizes can be reduced so as to prevent the "substantial overflow" of the down-counter. For example, an output portion of the data control unit 46 shown in FIG. 1 is provided so that DM1 to DM19 are changed to DM1 to DM17 to delete 2 bits as an example. Also, DQ1 to DQ18 may be changed to DQ1 to DQ16 to delete 2 bits as an example.

The data substituting means may be applied to the configuration of U.S. Pat. No. 5,708,395, likewise.

What is claimed is:

1. A frequency-multiplied clock signal output circuit comprising:
    a reference period counter that counts a period of a reference clock signal according to a clock signal that is shorter in a period than a reference clock signal that is output from a ring oscillator;
    timer means for timing a time for generating a frequency-multiplied clock signal by setting data from which the reference period data counted by the reference period counter is divided according to a multiplication ratio and conducting timing operation; and
    data substituting means for substituting a fixed value for processing data so that a data value is smaller than a value expressed by a given number of digits when it is determined that a value of the data to be set in the counter means is equal to or more than a given number of digits.

2. The frequency-multiplied clock signal output circuit according to claim 1, wherein the data substituting means sets all data of "1" in the timer means as the substituting data.

3. The frequency-multiplied clock signal output circuit according to claim 1, wherein the data substituting means substitutes the fixed value for a reference period data when the value of the reference period data is equal to or more than the given number of digits.

4. The frequency-multiplied clock signal output circuit according to claim 1, wherein the timer means includes a down-counter.

* * * * *